(12) United States Patent
Kwon

(10) Patent No.: US 7,468,924 B2
(45) Date of Patent: Dec. 23, 2008

(54) NON-VOLATILE MEMORY DEVICE CAPABLE OF REDUCING THRESHOLD VOLTAGE DISTRIBUTION

(75) Inventor: Wook-Hyun Kwon, Yongin (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 208 days.

(21) Appl. No.: 11/636,205

(22) Filed: Dec. 9, 2006

(65) Prior Publication Data

US 2008/0094923 A1    Apr. 24, 2008

(30) Foreign Application Priority Data

Oct. 23, 2006   (KR)   ........................ 10-2006-0103053

(51) Int. Cl.
*G11C 7/00*    (2006.01)

(52) U.S. Cl. ............. 365/195; 365/189.14; 365/185.33; 365/185.22

(58) Field of Classification Search ................. 365/195, 365/189.14, 185.33, 185.22
See application file for complete search history.

(56) References Cited

U.S. PATENT DOCUMENTS 7,385,850 B2 * 6/2008 Jeong et al. ............ 365/185.22

FOREIGN PATENT DOCUMENTS

| JP | 11-185491    | 7/1999  |
| JP | 2004 022112  | 1/2004  |
| JP | 2005 025891  | 1/2005  |
| JP | 2005 353242  | 12/2005 |
| KR | 1999 0075962 | 10/1999 |
| KR | 2000-0028302 | 5/2000  |
| KR | 1020000077428| 12/2000 |
| KR | 2001 0065151 | 7/2001  |
| KR | 2004 0057536 | 7/2004  |
| KR | 100673023    | 1/2007  |

OTHER PUBLICATIONS

English Abstract for Publication No. 11-185491.
English Abstract for Publication No. 1020000077428.
English Abstract for Publication No. 100673023.
English Abstract for Publication No. 100293635 (for 1999-0075962).

(Continued)

*Primary Examiner*—VanThu Nguyen
*Assistant Examiner*—Nam Nguyen
(74) *Attorney, Agent, or Firm*—F. Chau & Associates, LLC

(57) ABSTRACT

A method for programming a flash memory device which includes a plurality of memory cells arranged in rows and columns. The method includes programming selected memory cells from among the plurality of memory cells according to loaded data bits. Data bits are read from the programmed selected memory cells. It is determined whether each of the programmed memory cells has been successfully programmed based on the results of the reading step. The programming of memory cells that have been determined to have been successfully programmed are inhibited. The programming, reading, determining and inhibiting steps are repeated until each of the selected memory cells has been determined to have been successfully programmed. A memory cell that has been previously determined to have been successfully programmed and inhibited is uninhibited and subsequently re-programmed when it is determined that the previously inhibited memory cell is no longer successfully programmed.

20 Claims, 8 Drawing Sheets

OTHER PUBLICATIONS

English Abstract for Publication No. 1020010065151.
English Abstract for Publication No. 2004-022112.
English Abstract for Publication No. 1020040057536.
English Abstract for Publication No. 2005-025891.
English Abstract for Publication No. 2005-353242.
English Abstract for Publication No.: 2000-0028302.

* cited by examiner

NON-VOLATILE MEMORY DEVICE CAPABLE OF REDUCING THRESHOLD VOLTAGE DISTRIBUTION

CROSS-REFERENCE TO RELATED APPLICATIONS

This application claims priority under 35 U.S.C § 119 to Korean Patent Application 2006-103053 filed on Oct. 23, 2006, the entire contents of which are hereby incorporated by reference.

BACKGROUND OF THE INVENTION

1. Technical Field

The present disclosure relates to a semiconductor memory device and, more particularly, to non-volatile memory device capable of reducing threshold voltage distribution.

2. Discussion of the Related Art

A flash memory device is a kind of EEPROM where a plurality of memory regions called cells can be erased or programmed through a single program operation. A conventional EEPROM enables only one memory region to be erased or programmed at one time. This means that a flash memory device can operate at a higher and more effective speed. After a specific number of erase operations, all types of flash memories and EEPROM may wear out due to a breakdown of an insulating layer covering charge storage means used to store data.

A flash memory device stores information in such a manner that a power supply voltage is not required to keep information stored in the silicon chip. This means that information is kept without power consumption even if a power supply voltage applied to a chip is cut off. In addition, a flash memory device can resist physical impact and achieve fast read access time, especially when compared to a hard disk drive. For these characteristics, flash memory devices have been used as storage for devices that are powered by a battery. A flash memory device is classified into two groups, e.g., a NOR flash memory device and a NAND flash memory device according to a configuration of a logic gate used in each of storage devices.

A flash memory device stores information in an array of transistors called "cells," and each of the cells conventionally stores 1-bit of information. More advanced flash memory devices called "multi-level devices" can store more than 1-bit per cell by varying a charge amount on a floating gate of each cell.

In a NOR flash memory device, each cell is similar to a standard metal-oxide-semiconductor field-effect transistor (MOSFET) except that it has two gates. The first gate is a control gate analogous to those in MOS transistors, while the second gate is a floating gate surrounded by an insulating film. The floating gate is placed between the control gate and a substrate (or bulk). Since the floating gate is insulated by an insulating film, electrons on the floating gate are trapped, thus storing information. When electrons are placed on the floating gate, an electric field from the control gate is changed (partially countervailed) by electrons, which affects a threshold voltage of the memory cell. Accordingly, when a cell is read by applying a specific voltage to the control gate, current flows or does not flow according to a threshold voltage of a cell. This is controlled by a charge amount of the floating gate. The current is analyzed and, in the 1-bit cell, whether a current is sensed determines the state of the cell. The state of the cell is determined to be either 1 (unprogrammed) or 0 (programmed). Accordingly, stored data is reproduced in a multi-level cell device storing more than 1-bit per cell, in order to determine an electron amount stored in the floating gate, the amount of current flowing may be sensed, rather than sensing whether current flows.

A NOR flash cell is programmed by applying a program voltage to a control gate and a high voltage of, for example, 5V to 6V to a drain, with a source being grounded. According to this bias condition, current flows from the drain to the source. This programming manner is called hot-electron injection. In order to erase the NOR flash cell, a large voltage difference is forced between a control gate and a substrate (or bulk), which enables electrons to be discharged from a floating gate through F-N tunneling. In general, constituent elements of a NOR flash memory device are divided into erase segments called blocks or sectors. Memory cells in a sector all are erased at the same time. However, NOR programming can be carried out in a byte or word unit.

After a program operation is carried out, it is judged whether a memory cell is programmed to have a desired data value. This operation is referred to as a verify operation (or, a verify read operation). In general, a program operation and a verify operation constitute a loop (cycle), which may be repeated within a predetermined number of times. For example, after a memory cell is programmed, with a verify read voltage being applied to a selected word line, whether a threshold voltage of the programmed memory cell is higher than the verify read voltage is judged. If a threshold voltage of the programmed memory cell is higher than the verify read voltage, a program operation for the memory cell (marked by "10" in FIG. 1) is not performed in a next loop. Afterwards, this memory cell may be called a program end cell. On the other hand, if a threshold voltage of the programmed memory cell is lower than the verify read voltage, a program operation for the memory cell (marked by "11" in FIG. 1) is performed in a next loop. The number of program end cells may increase gradually according to repetition of program loops. For example, as illustrated in FIG. 2, the number of cells to be programmed may decrease gradually according to repetition of program loops.

A current or drain current flowing via a memory cell may be changed as a read operation is repeated. A variation of a drain current means a variation of a threshold voltage. In general, this phenomenon is called random telegraph noise (RTN). The RTN may have various causes. Typically, such a problem may be caused by a charge trapped at an insulation film between a floating gate (or a charge trap gate) and a substrate. Although a threshold voltage (marked by "20" in FIG. 3) of a memory cell is judged to be higher than a verify read voltage at a verify read operation, as illustrated in FIG. 3, a threshold voltage (marked by "21" in FIG. 3) of the memory cell is judged to be lower than the verify read voltage. This is because a threshold voltage of a memory cell is changed due to the above-described RTN.

In particular, as illustrated in FIG. 4, threshold voltages of memory cells placed at a lower/tail portion of a threshold voltage distribution are substantially varied due to an iterative read operation, while threshold voltages of memory cells placed at a center portion of a threshold voltage distribution are slightly varied due to an iterative read operation. As threshold voltages of memory cells placed at a lower/tail portion of a threshold voltage distribution are substantially varied, a read margin may be reduced. As a result, read errors may be generated and a threshold voltage distribution may be widened. Further, as illustrated in FIG. 5 showing a threshold voltage variation according to technology scaling, a variation of a threshold voltage due to the RTN may increase according to the technology scaling. In particular, a variation of a threshold voltage due to the RTN may cause substantial error in a multi-bit flash memory device where margin between states is less.

SUMMARY OF THE INVENTION

Exemplary embodiments of the present invention are directed to a method for programming a flash memory device which comprises memory cells arranged in rows and columns. The program method comprises programming selected memory cells according to loaded data bits. Data bits are read from the selected memory cells. The programming and reading steps are repeated until the read data bits all are judged to have passed. Program inhibit data bits of data bits to be programmed in the selected memory cells are re-established to program data bits by corresponding program data bits read out in the reading step.

Other exemplary embodiments of the present invention are directed to a flash memory device comprising a memory cell array having memory cells arranged in rows and columns. A write circuit programs selected memory cells of the memory cell array according to loaded data. A read circuit reads data from the selected memory cells of the memory cell array. Program inhibit data bits of data bits stored in the write circuit are changed into program data bits by corresponding program data bits read out at a verify operation.

Still other exemplary embodiments of the present invention are directed to a method for programming a flash memory device which includes memory cells arranged in rows and columns. The program method comprises programming selected memory cells according to loaded data bits. A verify read operation is performed for reading data bits from the selected memory cells. After the read data bits all are judged to have passed, an RTN read operation is carried out to read data bits from the selected memory cells. It is then judged whether at least one RTN bit exists in the read data bits. When no RTN bit exists, the RTN read operation and the judging operation are repeated.

Still other exemplary embodiments of the present invention are directed to a flash memory device comprising a memory cell array having memory cells arranged in rows and columns. A write circuit programs selected memory cells of the memory cell array according to loaded data. A read circuit reads data from the selected memory cells of the memory cell array. A controller controls the write circuit and the read circuit. After the selected memory cells are programmed, the controller controls the write and read circuits and an RTN detection read operation is performed in which data is read from the selected memory cells and it is judged whether at least one RTN bit exists in the read data.

BRIEF DESCRIPTION OF THE DRAWINGS

A more complete appreciation of the present disclosure and many of the attendant features thereof will be readily obtained as the same becomes better understood by reference to the following detailed description when considered in connection with the accompanying drawings, wherein.

DETAILED DESCRIPTION OF EXEMPLARY EMBODIMENTS

Figure 1:
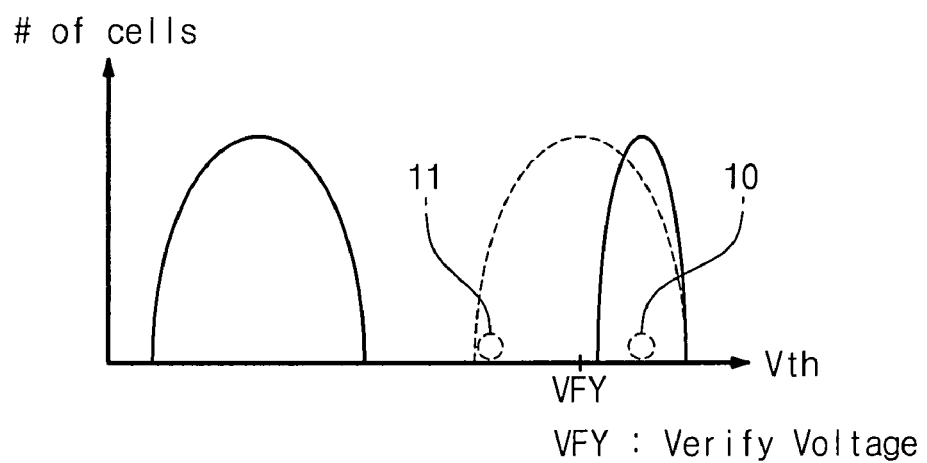
FIG. 1 is a diagram describing a threshold voltage variation according to a program operation.

Exemplary embodiment of the present invention will now be described more fully hereinafter with reference to the accompanying drawings. The invention, however, may be embodied in many different forms and should not be construed as limited to the exemplary embodiments set forth herein. In the drawings, like numbers refer to like elements throughout.

Figure 6:
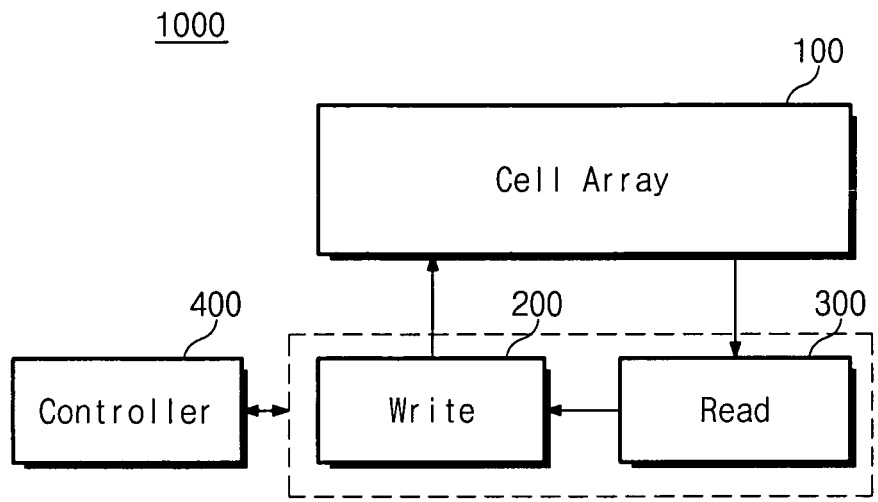
FIG. 6 is a block diagram showing a flash memory device according to an exemplary embodiment of the present invention.

FIG. 6 is a block diagram showing a flash memory device according to an exemplary embodiment of the present invention.

Referring to FIG. 6, a flash memory device 1000 according to an exemplary embodiment of the present invention includes a memory cell array 100, a write circuit 200, a read circuit 300, and a controller 400. The memory cell array 100 includes memory cells arranged in rows and columns, and each of the memory cells stores N-bit data (N is a positive integer). Each of the memory cells may be formed to have charge storing means such as a floating-gate structure, a charge trap structure, and the like. The write circuit 200 is controlled by the controller 400, and drives selected columns of the memory cell array 100 according to data to be programmed during a program operation. The read circuit 300 reads data from the memory cell array 100 via selected columns during a read operation including a normal read operation and a verify read operation. The controller 400 is configured to control an entire operation of the flash memory device 1000 according to the exemplary embodiment of the present invention.

In particular, according to the present flash memory device, data stored in the write circuit 200 may be changed by data read by the read circuit 300 at a verify operation. Data may be either one of program data or program inhibit data. Program data stored in the write circuit 200 is changed into program inhibit data when a threshold voltage of a corresponding memory cell is higher than a verify read voltage. As described above, a threshold voltage of a program-passed memory cell may become lower than the verify read voltage due to the RTN. Hereinafter, such a memory cell is called an RTN cell (or RTN bit). If a threshold voltage of a program-passed memory cell becomes lower than the verify read voltage due to the RTN, data (e.g., program inhibit data) of the write circuit 300 corresponding to the program-passed memory cell may be again changed into program data. For example, a memory cell having a threshold voltage (lower than the verify read voltage) changed due to the RTN is again programmed in a next loop. As a result, it is possible to program memory cells sensitive to the RTN so as to have a threshold voltage higher than the verify read voltage.

Figure 7:
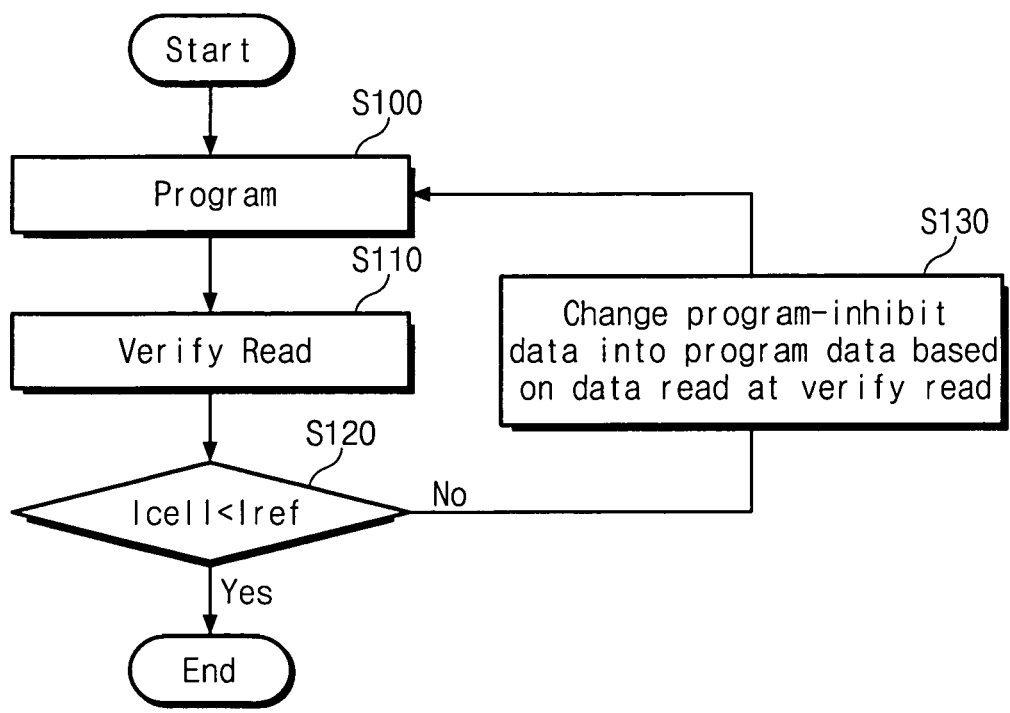
FIG. 7 is a flowchart showing a program method of a flash memory device according to an exemplary embodiment of the present invention.
Figure 8:
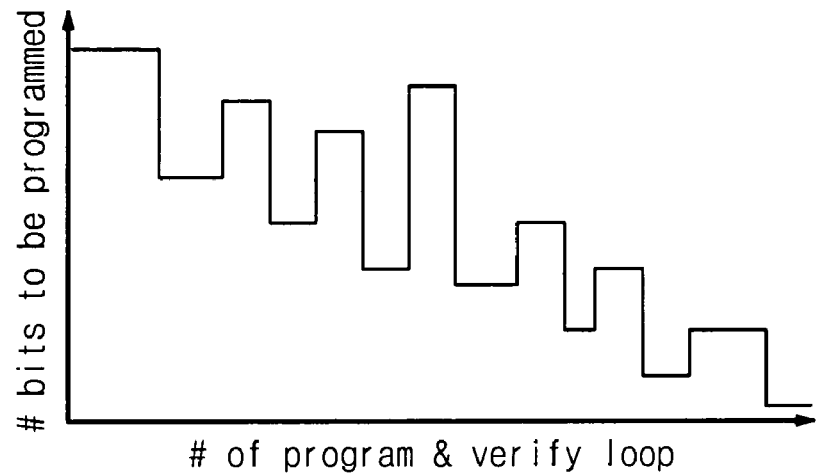
FIG. 8 is a diagram showing a variation of an RTN cell number at repetition of program loops.

FIG. 7 is a flowchart for describing a program method of a flash memory device according to an exemplary embodiment of the present invention. FIG. 8 is a diagram showing a variation of an RTN cell number at repetition of program loops. Hereinafter, a program method of a flash memory device according to an exemplary embodiment of the present invention will be more fully described with reference to the accompanying drawings.

Data is first loaded onto a write circuit 200 by a controller 400. The loaded data is programmed in a memory cell array 100 by the controller 400 (Step S100). Then, a verify read operation is carried out via a read circuit 300 (Step S110). It is judged whether the threshold voltages of programmed memory cells are higher than a verify read voltage (Step S120). In the event that threshold voltages of programmed memory cells are higher than the verify read voltage, a cell current Icell flowing via a programmed memory cell is less than a reference current Iref. In the event that threshold voltages of programmed memory cells are lower than the verify read voltage, a cell current Icell flowing via a programmed memory cell is more than the reference current Iref. If threshold voltages of programmed memory cells are judged to be higher than the verify read voltage (Yes, Step S120), the procedure is ended. If threshold voltages of programmed memory cells are judged to be lower than the verify read voltage (No, Step S120), program inhibit data is changed into program data according to data read at the verify read operation (Step S130). Afterwards, the procedure goes to the step S100.

In particular, whether threshold voltages of programmed memory cells are higher than the verify read voltage, may be judged by whether data read by the read circuit 300 is program inhibit data or program data. In a case where data read by the read circuit 300 is program inhibit data, data (e.g., program data) stored in the write circuit 200 may be changed into program inhibit data by data read by the read circuit 300 at the verify read operation. In a case where data read by the read circuit 300 is program data, data (e.g., program data) stored in the write circuit 200 may be maintained regardless of data read by the read circuit 300 at the verify read operation. If at least one data bit is judged to be a program data bit, the program and verify operations may be repeated in the same manner as described above.

Figure 2:
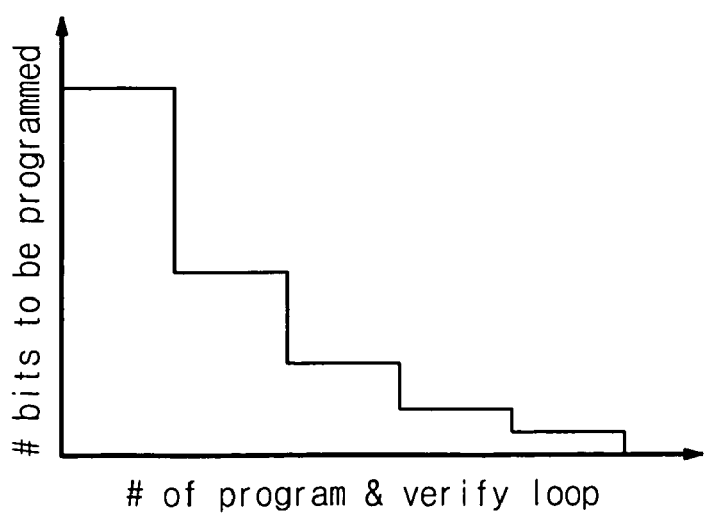
FIG. 2 is a diagram showing that the number of memory cells to be programmed is reduced according to repetition of program loops.
Figure 3:
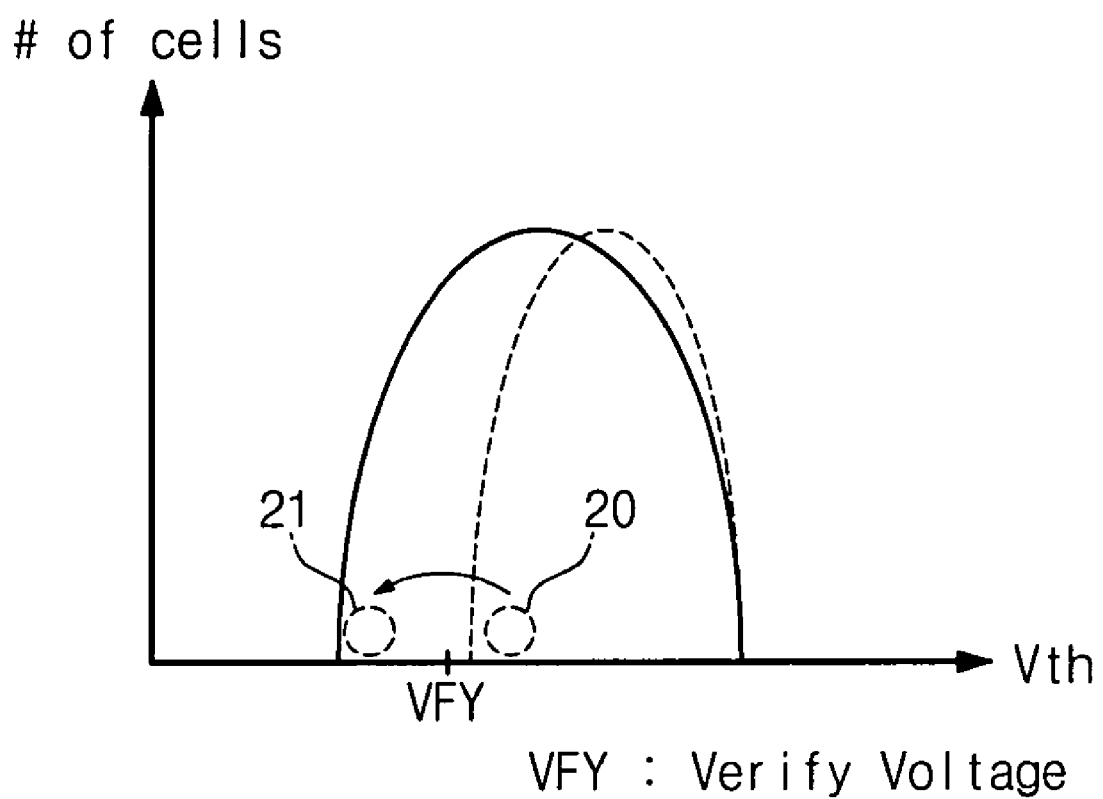
FIG. 3 is a diagram showing a threshold voltage variation of a program-passed memory cell due to a random telegraph noise.
Figure 4:
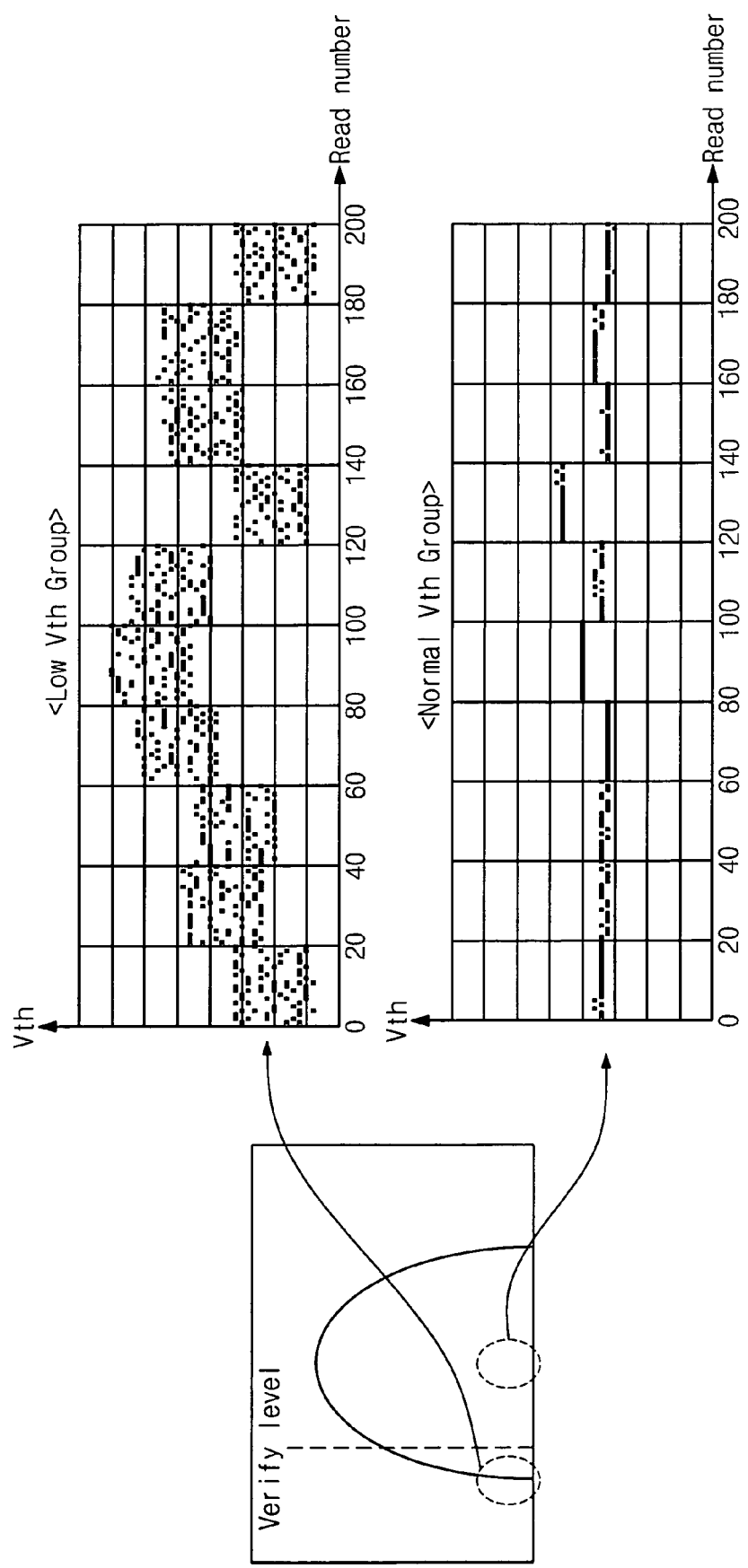
FIG. 4 is a diagram showing a threshold voltage variation according to a random telegraph noise.
Figure 5:
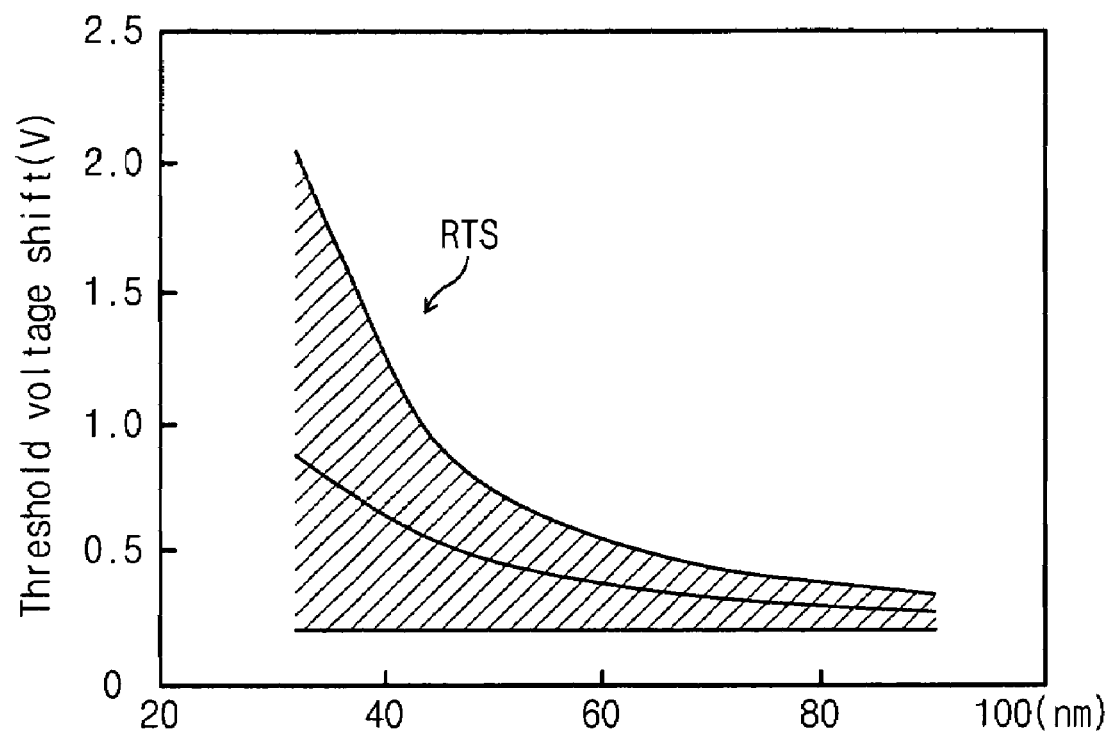
FIG. 5 is a diagram showing a threshold voltage variation according to technology scaling and random telegraph noise.
Figure 9:
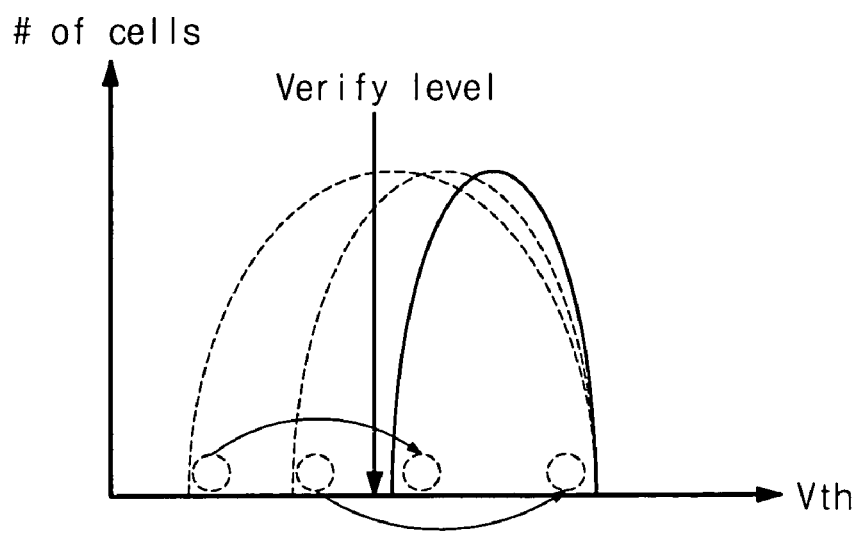
FIG. 9 is a diagram showing reduction of a threshold voltage distribution in the event that the present program method is applied.

With repetition of the program and verify operations, program-passed memory cells may be judged to be program-failed memory cells due to the RTN. This means that the number of memory cells to be programmed is increased and reduced as illustrated in FIG. 8, not reduced increasingly as illustrated in FIG. 2. In order to reflect this variation at a program operation, in a case where data read at a verify operation is program data, program inhibit data (changed from program data to program inhibit data at a previous loop) stored in the write circuit 200 may be changed into program data by data read at the verify operation. Accordingly, although program-passed memory cell is judged to be program-failed memory cell (RTN cell) due to the RTN, the RTN cell may be again programmed in a next loop. With this programming manner, as illustrated in FIG. 9, it is possible to program memory cells sensitive to the RTN so as to have a threshold voltage higher than a verify read voltage. Accordingly, it is possible to reduce a threshold voltage distribution.

Figure 10:
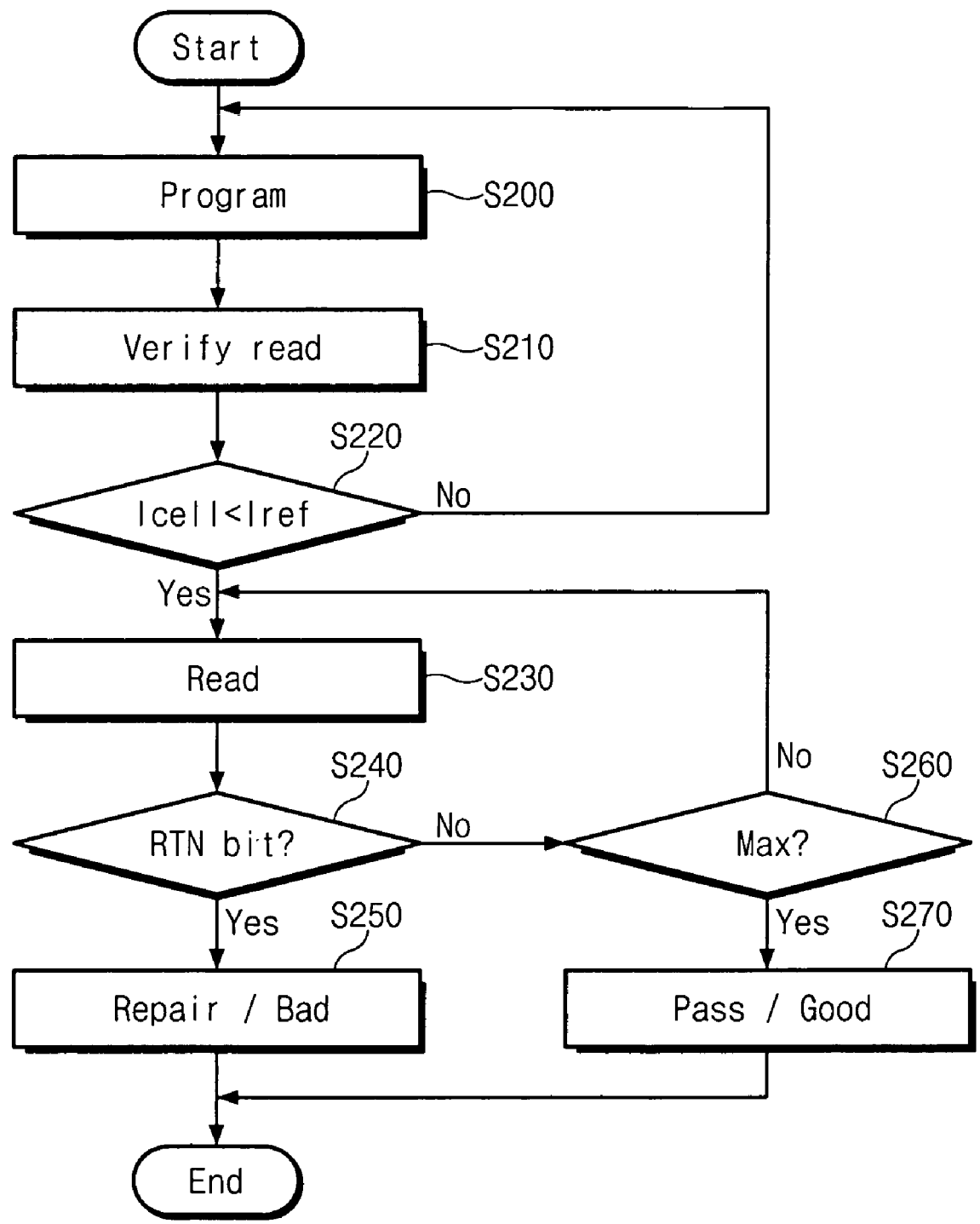
FIG. 10 is a flowchart showing a program method of a flash memory device according to another exemplary embodiment of the present invention.

FIG. 10 is a flowchart describing a program method of a flash memory device according to another exemplary embodiment of the present invention. A method for programming a flash memory device according to another exemplary embodiment of the present invention is more fully described below with reference to the accompanying drawings.

In FIG. 10, steps S200 to S220 are similar to steps S100 to S120 in FIG. 7 except that data stored in a write circuit 200 is not changed by data read at a verify operation. When data read at the verify operation is judged to be program-failed data due to RTN, data stored in the write circuit 200 is changed into program data by data read at the verify operation as described in FIG. 7. In the method for programming shown in FIG. 10, when data read at the verify operation is judged to be program-failed data due to the RTN, data stored in the write circuit 200 is not changed into program data by data read at the verify operation.

In step S220, if threshold voltages of programmed memory cells are judged to be higher than a verify read voltage (Yes, Step S220), a read operation (or, RTN screen read operation) may be carried out (S230). In step S230, a verify read voltage is applied to a selected word line. For example, a read operation is carried out with the verify read voltage being applied to the selected word line. A controller 400 judges whether at least one RTN bit of read data bits exists (S240). Herein, the RTN bit indicates a memory cell having a threshold voltage lower than the verify read voltage. If at least one RTN bit exists (Yes, Step S240), a sector having the RTN bit may be repaired or treated as a bad sector (S250). Afterwards, the procedure is ended. If no RTN bit exists: No, Step S240), there is judged whether a read number reaches a predetermined number (S260). If a read number does not reach a predetermined number (No, Step S260), the procedure goes to step S230. On the other hand, if a read number reaches a predetermined number (Yes, Step S260), the program operation is judged as program pass or a flash memory device is judged to be a good device (S270). Afterwards, the procedure is ended.

Figure 11:
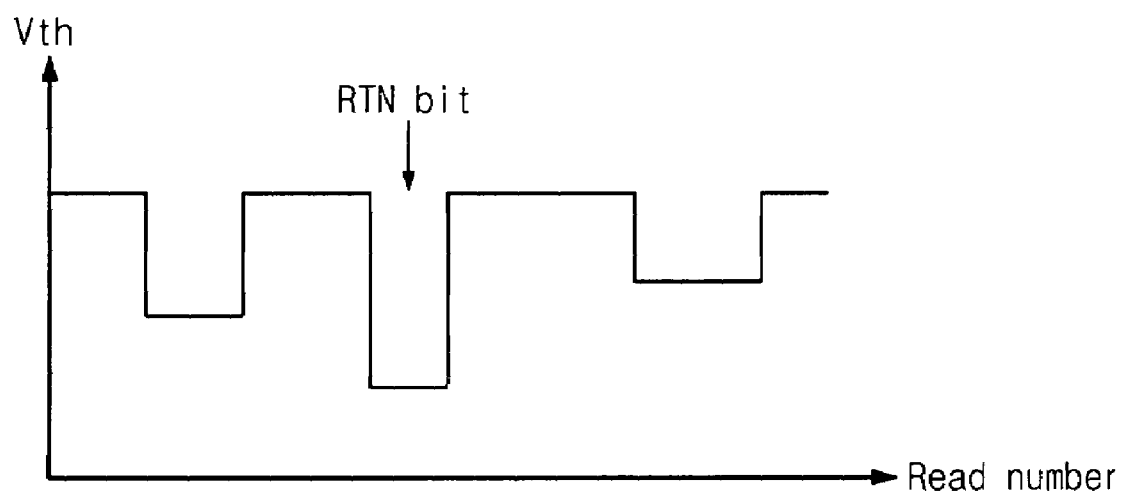
FIG. 11 is a diagram showing RTN bits detected when the program method shown in FIG. 10 is applied.

In the program method shown in FIG. 10, after a program operation has ended, an operation (hereinafter, referred to as an RTN bit detection operation) for judging whether at least one RTN bit exists may be executed. In accordance with this RTN bit detection operation, as illustrated in FIG. 11, a threshold voltage of a memory cell sensitive to RTN may be substantially changed. Since such an RTN bit causes read error, a sector including the RTN bit is repaired or is treated as a bad sector. The program method in FIG. 10 can be applied in various ways. For example, during a test procedure, the program method in FIG. 10 can be used to detect a chip having RTN bits and to treat the detected chip as a bad chip. Alternatively, the program method in FIG. 10 may be used after specific PE cycling in order to secure the reliability of a manufactured chip.

Although the present disclosure has been described in connection with the exemplary embodiment of the present invention illustrated in the accompanying drawings, it is not limited thereto. It will be apparent to those skilled in the art that various substitution, modifications and changes may be thereto without departing from the scope and spirit of the disclosure.

What is claimed is:

1. A method for programming a flash memory device which comprises a plurality of memory cells arranged in rows and columns, the method comprising:
  programming selected memory cells from among the plurality of memory cells according to loaded data bits;

reading data bits from the programmed selected memory cells;

determining whether each of the programmed memory cells has been successfully programmed based on the results of the reading step;

inhibiting the programming of memory cells that have been determined to have been successfully programmed; and repeating the programming, reading, determining and inhibiting steps until each of the selected memory cells has been determined to have been successfully programmed, wherein a memory cell that has been previously determined to have been successfully programmed and inhibited is uninhibited and subsequently re-programmed when it is determined that the previously inhibited memory cell is no longer successfully programmed.

2. The method of claim 1, wherein the programming, reading, determining and inhibiting steps are repeated for up to a predetermined number of times.

3. The method of claim 1, wherein each of the plurality of memory cells stores a single bit of data.

4. The method of claim 1, wherein each of the plurality of memory cells stores multiple bits of data.

5. A flash memory device comprising:

a memory cell array having a plurality of memory cells arranged in rows and columns;

a write circuit configured to program selected memory cells of the memory cell array according to loaded data; and a read circuit configured to read data from the selected memory cells of the memory cell array, wherein program inhibit data bits of data bits stored in the write circuit are changed into program data bits by corresponding program data bits read out at a verify operation.

6. The flash memory device of claim 5, wherein the program data bits of data bits stored in the write circuit are changed into program inhibit data bits by corresponding program inhibit data bits read out at the verify operation.

7. The flash memory device of claim 5, wherein each of the plurality of memory cells stores a single bit of data or multiple bits of data.

8. The flash memory device of claim 5, wherein each of the plurality of memory cells comprises a floating gate structure or a charge trap structure.

9. The flash memory device of claim 5, wherein the change of program inhibit data bits into program data bits is due to a random telegraph noise (RTN).

10. A method for programming a flash memory device comprising a plurality of memory cells arranged in rows and columns, the method comprising:

programming memory cells selected from the plurality of memory cells according to loaded data bits, performing a verify read operation for reading data bits from the selected memory cells;

after each of the read data bits are judged to have passed at the verify read operation, executing an RTN read operation for reading data bits from the selected memory cells;

judging whether at least one RTN bit exists in the read data bits; and when no RTN bit exists, repeating the RTN read operation and the judging operation.

11. The method of claim 10, wherein when at least one RTN bit exists, a sector including the RTN bit is repaired with a redundant sector.

12. The method of claim 10, wherein when at least one RTN bit exists, a sector including the RTN bit is treated as a bad sector.

13. The method of claim 10, wherein when at least one RTN bit exists, during testing, the flash memory device is treated as a bad chip.

14. A flash memory device comprising:

a memory cell array comprising a plurality of memory cells arranged in rows and columns;

a write circuit configured to program memory cells selected from among the plurality of memory cells of the memory cell array according to loaded data, a read circuit configured to read data from the selected memory cells of the memory cell array; and a controller configured to control the write circuit and the read circuit, wherein after the selected memory cells are programmed, the controller controls the write and read circuits to execute an RTN detection read operation in which data is read from the selected memory cells and determines whether at least one RTN bit exists in the read data.

15. The flash memory device of claim 14, wherein when it is determined that no RTN bit exists in the read data, the RTN detection read operation is repeated up to a predetermined number of times.

16. The flash memory device of claim 14, wherein when it is determined that at least one RTN bit exists, a sector comprising the RTN bit is repaired with a redundant sector.

17. The flash memory device of claim 14, wherein when it is determined that at least one RTN bit exists, a sector comprising the RTN bit is treated as a bad sector.

18. The flash memory device of claim 14, wherein when it is determined that at least one RTN bit exists, the flash memory device is treated as a bad chip.

19. The flash memory device of claim 14, wherein each of the plurality of memory cells stores a single bit of data or multiple bits of data.

20. The flash memory device of claim 14, wherein each of the plurality of memory cells comprises a floating gate structure or a charge trap structure.

* * * * *